United States Patent
Wostyn

(10) Patent No.: US 10,515,855 B2
(45) Date of Patent: Dec. 24, 2019

(54) INTEGRATION OF SEMICONDUCTOR STRUCTURES

(71) Applicant: IMEC VZW, Leuven (BE)

(72) Inventor: Kurt Wostyn, Lubbeek (BE)

(73) Assignee: IMEC VZW, Leuven (BE)

( * ) Notice: Subject to any disclaimer, the term of this patent is extended or adjusted under 35 U.S.C. 154(b) by 26 days.

(21) Appl. No.: 15/913,546

(22) Filed: Mar. 6, 2018

(65) Prior Publication Data

US 2018/0286762 A1 Oct. 4, 2018

(30) Foreign Application Priority Data

Mar. 29, 2017 (EP) .................................... 17163709

(51) Int. Cl.
*H01L 21/8234* (2006.01)
*H01L 29/06* (2006.01)
*H01L 29/786* (2006.01)
*H01L 21/02* (2006.01)
*H01L 29/423* (2006.01)
(Continued)

(52) U.S. Cl.
CPC ...... *H01L 21/823431* (2013.01); *B82Y 10/00* (2013.01); *H01L 21/02664* (2013.01); *H01L 21/2255* (2013.01); *H01L 21/823412* (2013.01); *H01L 27/0886* (2013.01); *H01L 29/0673* (2013.01); *H01L 29/42392* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/78654* (2013.01); *H01L 29/78684* (2013.01);
(Continued)

(58) Field of Classification Search
CPC combination set(s) only.
See application file for complete search history.

(56) References Cited

U.S. PATENT DOCUMENTS 8,020,805 B2 9/2011 Choi et al.
8,529,825 B2 9/2013 Chu et al.
(Continued)

OTHER PUBLICATIONS

European Search Report, European Patent Application No. 17163709.3, dated Sep. 27, 2017, 7 pages.

*Primary Examiner* — Zandra V Smith
*Assistant Examiner* — Andre C Stevenson
(74) *Attorney, Agent, or Firm* — McDonnell Boehnen Hulbert & Berghoff LLP

(57) ABSTRACT

At least one embodiment relates to a method for integrating $Si_{1-x}Ge_x$ structures with $Si_{1-x'}Ge_{x'}$ structures in a semiconductor device. The method includes providing a device that includes a plurality of $Si_{1-x}Ge_x$ structures, where $0 \leq x < 1$. The method also includes depositing a layer of $GeO_2$ on a subset of the $Si_{1-x}Ge_x$ structures. Further, the method includes heating at least the subset of $Si_{1-x}Ge_x$ structures at a temperature high enough and for a time long enough to transform the subset of $Si_{1-x}Ge_x$ structures into a subset of $Si_{1-x'}Ge_{x'}$ structures with $x' > x$.

20 Claims, 4 Drawing Sheets

(51) Int. Cl.
  *H01L 29/775* (2006.01)
  *H01L 29/66* (2006.01)
  *B82Y 10/00* (2011.01)
  *H01L 21/225* (2006.01)
  *H01L 27/088* (2006.01)
  *H01L 29/78* (2006.01)

(52) U.S. Cl.
  CPC .... *H01L 29/78696* (2013.01); *H01L 29/6653* (2013.01); *H01L 29/6681* (2013.01); *H01L 29/66553* (2013.01); *H01L 29/7853* (2013.01)

(56) References Cited

U.S. PATENT DOCUMENTS

| | | | |
|---|---|---|---|
| 8,652,891 | B1 | 2/2014 | Yin et al. |
| 8,765,563 | B2 | 7/2014 | Pillarisetty et al. |
| 9,257,450 | B2 | 2/2016 | Loubet et al. |
| 9,431,539 | B2 | 8/2016 | Qi et al. |
| 9,548,387 | B2 | 1/2017 | Yin et al. |
| 9,634,007 | B2 | 4/2017 | Pillarisetty et al. |
| 9,716,142 | B2 | 7/2017 | Bi et al. |
| 9,905,672 | B2 | 2/2018 | Wang et al. |
| 9,984,940 | B1 | 5/2018 | Chu et al. |
| 9,985,101 | B2 | 5/2018 | Hatem et al. |
| 10,079,233 | B2 * | 9/2018 | Chao .................. H01L 27/0924 |
| 2009/0090934 | A1 | 4/2009 | Tezuka et al. |
| 2011/0147811 | A1 | 6/2011 | Kavalieros et al. |
| 2011/0193178 | A1 | 8/2011 | Chang et al. |
| 2014/0065841 | A1 * | 3/2014 | Matero ............... H01L 21/0228 438/778 |
| 2016/0233303 | A1 | 8/2016 | Chen et al. |
| 2017/0005169 | A1 | 1/2017 | Loubet et al. |
| 2017/0040465 | A1 * | 2/2017 | Yang ................. H01L 29/78684 |

* cited by examiner

INTEGRATION OF SEMICONDUCTOR STRUCTURES

CROSS-REFERENCE TO RELATED APPLICATIONS

The present application is a non-provisional patent application claiming priority to European Patent Application No. EP 17163709.3, filed Mar. 29, 2017, the contents of which are hereby incorporated by reference.

FIELD OF THE DISCLOSURE

The present disclosure relates to semiconductor devices and in particular to the integration of semiconductor structures of differing chemical natures in such devices.

BACKGROUND

In the fabrication of semiconductor devices, it can be useful to co-integrate semiconductor structures comprising different semiconductor materials, such as different channel materials. However, this co-integration can be challenging to achieve. A first issue may for example be due to difficulty in epitaxial growth of a first semiconductor material on a different semiconductor material. A further issue may also be the increased complexity of the device layout and its impact on several modules, e.g. separate internal spacer modules may be necessary for the different channel materials and making these is typically not trivial. An additional issue could also be the vertical misalignment between the different semiconductor materials, e.g. in the case where an alternating stack of Si and SiGe layers is formed, wherein alternatively Si and SiGe are selectively etched with respect to one another, the remaining Si and SiGe structures will be vertically displaced with respect to each other.

U.S. Pat. No. 9,257,450 B2 describes a method for forming a stack of alternating layers of first and second semiconductor materials, forming fins from the stack and selectively removing sidewall portions of the second semiconductor material from the fins to define recesses therein. A possible method for integrating semiconductor structures of differing chemical natures is further disclosed as forming different stacks of alternating layers, comprising different first and second semiconductor materials, in different regions on the substrate; however, forming such diverse stacks on a substrate is typically not trivial. This may be the case when a close integration of the different materials is desired, including the formation of closely packed stacks of small dimensions.

There is thus still a need in the art for methods and devices which improve some or all of these issues.

SUMMARY

Some embodiments may provide methods and devices for integrating semiconductor structures of differing chemical natures.

In some embodiments, the integrated semiconductor structures differ in chemical composition, thereby enabling different sub-devices to be distinctively tuned (e.g. using different materials for n- and p-devices).

In some embodiments, the chemical composition of the different semiconductor structures can be easily independently tuned with few or no integration problems.

Some embodiments may permit the co-integration of Si (or $Si_{1-x}Ge_x$, with $0 \le x < 1$) channels with Ge (or $Si_{1-x'}Ge_{x'}$, with $x < x' \le 1$) channels in CMOS devices.

Some embodiments may have no vertical displacement between corresponding semiconductor structures in different sub-devices within a same semiconductor device. The above is accomplished by a method and device according to the present disclosure.

In a first aspect, the present disclosure relates to a method for integrating $Si_{1-x}Ge_x$ structures with $Si_{1-x'}Ge_{x'}$ structures in a semiconductor device, comprising:
   a. providing a device comprising a plurality of $Si_{1-x}Ge_x$ structures, wherein $0 \le x < 1$,
   b. depositing a layer of $GeO_2$ on a subset of the $Si_{1-x}Ge_x$ structures, and
   c. heating at least the subset of $Si_{1-x}Ge_x$ structures at a temperature high enough and for a time long enough to transform the subset of $Si_{1-x}Ge_x$ structures into a subset of $Si_{1-x'}Ge_{x'}$ structures with $x' > x$.

In a second aspect, the present disclosure relates to a semiconductor device, comprising
   i. a $Si_{1-x}Ge_x$ structure with $0 \le x < 1$, and
   ii. a $Si_{1-x'}Ge_{x'}$ structure with $x < x' \le 1$, and
   iii. a $Si_{1-y}Ge_yO_2$ layer on the $Si_{1-x'}Ge_{x'}$ structure with $0 < y < 1$.

In a third aspect, the present disclosure relates to a semiconductor device comprising:
   a substrate having a top surface,
   a longitudinal $Si_{1-x}Ge_x$ structure having a first longitudinal axis running parallel to the top surface of the substrate and separated therefrom by a non-null distance d,
   a longitudinal $Si_{1-x'}Ge_{x'}$ structure having a second longitudinal axis running parallel to the top surface of the substrate and separated therefrom by the non-null distance d so that both the first and the second longitudinal axis belong to a same plane parallel to the top surface of the substrate.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics and features will become apparent from the following detailed description, taken in conjunction with the accompanying drawings, which illustrate, by way of example, the principles of various embodiments. This description is given for the sake of example only, without limiting the scope of the invention. The reference figures quoted below refer to the attached drawings.

Figure 1:
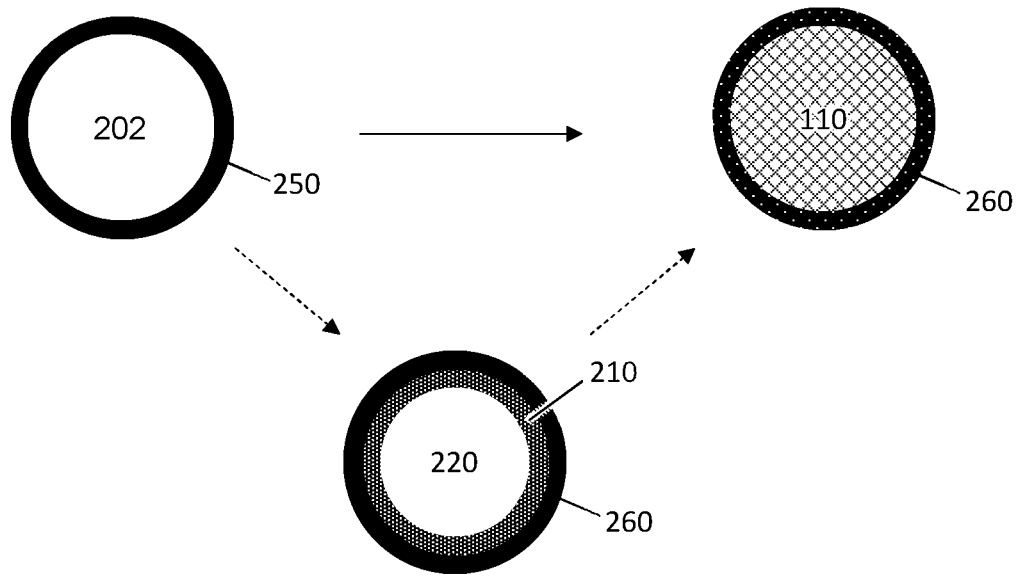
FIG. 1 is a schematic representation of a method for transforming a $Si_{1-x}Ge_x$ nanowire into a $Si_{1-x'}Ge_{x'}$ nanowire, according to example embodiments.

In the different figures, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, over, on and the like in the description and the claims are used for descriptive purposes and not necessarily for describing relative positions. It is to be understood that the terms so used are interchangeable with their antonyms (e.g. bottom, under, etc.) under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments may be practiced without these specific details. In other instances, well-known methods, structures and techniques have not been shown in detail in order not to obscure an understanding of this description.

The following terms are provided solely to aid in the understanding.

As used herein, when a first material is said to be etched selectively with respect to a second material, this means that the first material is etched faster than the second material. In some embodiments, the etching process would etch the first material at least twice faster, at least five times faster, or at least 10 times faster, than the second material. In some embodiments, the second material may be substantially not etched by the etching process.

Figure 2:
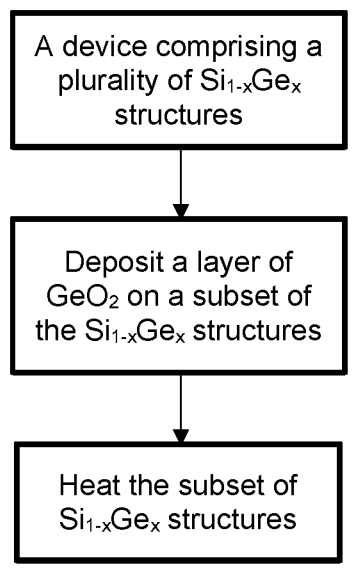
FIG. 2 is a flow chart showing the main steps in a method, according to example embodiments.

In a first aspect, the present disclosure relates to a method for integrating $Si_{1-x}Ge_x$ structures with $Si_{1-x'}Ge_{x'}$ structures in a semiconductor device, comprising:
  a. providing a device comprising a plurality of $Si_{1-x}Ge_x$ structures, wherein $0 \leq x < 1$,
  b. depositing a layer of $GeO_2$ on a subset of the $Si_{1-x}Ge_x$ structures, and
  c. heating at least the subset of $Si_{1-x}Ge_x$ structures at a temperature high enough and for a time long enough to transform the subset of $Si_{1-x}Ge_x$ structures into a subset of $Si_{1-x'}Ge_{x'}$ structures with $x' > x$. This first aspect is represented in the flowchart of FIG. 2.

The semiconductor device in the present disclosure typically comprises at least one sub-device, such as a transistor (e.g. a field effect transistor), or at least two sub-devices. In embodiments, one of the at least two sub-devices may comprise at least one of the $Si_{1-x}Ge_x$ structures, while another of the at least two sub-devices may comprise at least one of the $Si_{1-x'}Ge_{x'}$ structures. In embodiments, a sub-device comprising at least one of the $Si_{1-x}Ge_x$ structures may not comprise any $Si_{1-x'}Ge_{x'}$ structures. In embodiments, a sub-device comprising at least one of the $Si_{1-x'}Ge_{x'}$ structures may not comprise any $Si_{1-x}Ge_x$ structures. In embodiments, the $Si_{1-x}Ge_x$ and $Si_{1-x'}Ge_{x'}$ structures may be transistor channels.

The $Si_{1-x}Ge_x$ structures have a composition such that $0 \leq x < 1$. In embodiments, a $Si_{1-x}Ge_x$ structure may be a SiGe or a Si structure. In embodiments, the $Si_{1-x}Ge_x$ structures provided in step a may have at least one dimension equal to or smaller than 25 nm, equal to or smaller than 15 nm, or equal to or smaller than 10 nm. The at least one dimension may for example be a length, a width or a height of the structure. The at least one dimension is typically a width and/or height of the structure. In embodiments, the $Si_{1-x}Ge_x$ structures provided in step a may be nanowires or nanosheets. In embodiments, the $Si_{1-x}Ge_x$ structures may be nanowires having a width of from 3 to 20 nm or from 5 to 10 nm, and a height of from 3 to 20 nm or from 5 to 10 nm. The width and/or height of a nanowire, if it has a circular cross-section, are typically equal and may also be referred to as the diameter of the nanowire.

The $Si_{1-x'}Ge_{x'}$ structures have a composition such that $x' > x$. $x'$ may for example be from 0.05 to 1, such as from 0.2 to 1. In embodiments, a $Si_{1-x'}Ge_{x'}$ structure may thus be a SiGe or a Ge structure. For instance, x may be 0 and x' may be from 0.25 to 0.45 or x may be from 0.50 to 0.70 and x' may be 1.

Step b of depositing a layer of $GeO_2$ on a subset of the $Si_{1-x}Ge_x$ structures, may typically comprise masking the complementary subset of $Si_{1-x}Ge_x$ structures which is not to be transformed into $Si_{1-x'}Ge_{x'}$ structures. For instance, a masking layer may be applied over the plurality of $Si_{1-x}Ge_x$ structures and the mask may be opened above that subset which is to be transformed. It is understood that this step could easily be repeated to achieve an integration of $Si_{1-x}Ge_x$, $Si_{1-x'}Ge_{x'}$, $Si_{1-x''}Ge_{x''}$, etc. structures (wherein $x < x' < x''$, etc.).

In embodiments, the layer of $GeO_2$ in step b may be from 0.1 to 10 nm thick, such as from 0.5 to 2.5 nm thick. The thickness of the layer of $GeO_2$ typically plays a role in the composition (i.e. the value of x') of the $Si_{1-x'}Ge_{x'}$ structures that is obtained, wherein a thicker layer of $GeO_2$ typically results in a higher Ge concentration (i.e. higher value of x'). In embodiments, step b may consist in depositing a conformal layer of $GeO_2$ on the subset of the $Si_{1-x}Ge_x$ structures. In some embodiments, even if step c is not performed long enough and/or at a temperature high enough to achieve a uniform chemical composition across the whole section of the structure, a conformal layer of $GeO_2$ may allow the chemical composition to be radially symmetrical. A radial symmetry of the nanowire chemical composition provides a core-shell type of structure where band-offsets drive hole injection into the shell regions. Such radially symmetrical nanowires are also promising candidates for thermoelectric energy conversion. In embodiments, step b may be performed by atomic layer deposition. Atomic layer deposition allows the deposition of a conformal layer having a very uniform and well-defined thickness.

Without being bound by theory, it is believed that heating the subset of $Si_{1-x}Ge_x$ structures enables a reaction between $GeO_2$ and $Si_{1-x}Ge_x$, thereby increasing the Ge concentration in the $Si_{1-x'}Ge_{x'}$:

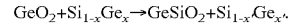

$$GeO_2 + Si_{1-x}Ge_x \rightarrow GeSiO_2 + Si_{1-x'}Ge_{x'}.$$

In embodiments, step c may be performed at a temperature of at least 400° C., at least 500° C., at least 600° C., or at least 750° C. In some embodiments, step c may be performed in the absence of a further compound able to oxidize the $Si_{1-x}Ge_x$ structure.

In some embodiments, a $Si_{1-x'}Ge_{x'}$ structure may, during or after step c, have an inhomogeneous Ge concentration, such as a Ge concentration characterized by a spatial gradient. The $Si_{1-x'}Ge_{x'}$ structure may for example have a higher Ge concentration near a surface of the $Si_{1-x'}Ge_{x'}$ structure compared to a Ge concentration near a centre (i.e. away from the surface) of the $Si_{1-x'}Ge_{x'}$ structure.

In some embodiments, there may exist a location in the $Si_{1-x'}Ge_{x'}$ structure obtained after step c, within 15 nm, 10 nm, or 5 nm of a surface of the $Si_{1-x'}Ge_{x'}$ structure, which has a Ge concentration at least 10% higher, at least 20% higher, or at least 30% higher, than at the corresponding location in the $Si_{1-x}Ge_x$ structure obtained after step a. In some embodiments, there may exist a location in the $Si_{1-x'}Ge_{x'}$ structure obtained after step c, beyond 15 nm of any surface of the $Si_{1-x'}Ge_{x'}$ structure, which has a Ge concentration within 5%, such as within 2%, in absolute measure, than at the corresponding location in the $Si_{1-x}Ge_x$ structure obtained after step a.

In embodiments, step c may be performed for a time long enough (such as 1 hour or more) to entirely homogenize the chemical composition of at least one of the $Si_{1-x'}Ge_{x'}$ structures. In embodiments, step c may comprise heating the $Si_{1-x}Ge_x$ structure to a temperature below the melting temperature of the $Si_{1-x}Ge_x$ structure. In some embodiments, step c may comprise heating the $Si_{1-x}Ge_x$ structure to a temperature below the melting temperature of the $Si_{1-x'}Ge_{x'}$ structure obtained in step c. For instance, step c may comprise heating the $Si_{1-x}Ge_x$ structure to a temperature of 937° C. or below. A temperature of 937° C. or below may be below the melting point of the $Si_{1-x'}Ge_{x'}$ structure since a temperature of 937° C. is below the melting point of Ge.

Performing step c at such a temperature may avoid deterioration (such as changes in the geometric shape) of the $Si_{1-x}Ge_x$ structure due to melting.

In embodiments, after completion of step c, the layer of $GeO_2$ provided in step b may be removed after it has been transformed into a layer of $Si_{1-y}Ge_yO_2$ (with $0<y<1$) during step c. Furthermore, after this removal, step b and step c may be repeated to further increase the Ge concentration (x') in the $Si_{1-x'}Ge_{x'}$ structure. In other embodiments, the layer of $Si_{1-y}Ge_yO_2$ (with $0<y<1$) may be kept in place and serve as a passivation oxide.

In embodiments, in step a, providing a plurality of $Si_{1-x}Ge_x$ structures may comprise providing two or more fin structures, each fin structure comprising one or more $Si_{1-x}Ge_x$ structures alternated with a sacrificial material, followed by selectively removing the sacrificial material with respect to the $Si_{1-x}Ge_x$ structures. The sacrificial material may be of formula $Si_{1-x'}Ge_{x'}$ (see e.g. example 2 vs the comparative example). Furthermore, only one type of selective removal, i.e. of the sacrificial material with respect to the $Si_{1-x}Ge_x$ structures, is performed; two forms of selective removal with opposite selectivity may not be used (see e.g. example 2 vs the comparative example). In embodiments, the one or more $Si_{1-x}Ge_x$ structures may be attached by their opposite ends to anchoring structures (e.g. source and drain contacts, dummy source and drain contacts, or internal spacers) and, after selectively removing the sacrificial material, the one or more $Si_{1-x}Ge_x$ structures may remain suspended through the anchoring structures. In embodiments, an internal spacer may be provided at an end of the sacrificial material and selectively removing the sacrificial material may comprise removing the sacrificial material while preserving the internal spacer. When internal spacers are used, some embodiments may all be made of the same material (see e.g. example 2 vs. the comparative example).

In embodiments, the method may further comprise after step c, forming a transistor, such as a field effect transistor (FET), by forming a gate covering part of the $Si_{1-x}Ge_x$ structures or $Si_{1-x'}Ge_{x'}$ structures, thereby defining a channel in each of the parts, by forming a source and a drain region in the $Si_{1-x}Ge_x$ structures or $Si_{1-x'}Ge_{x'}$ structure at opposite ends of each channel and by providing a source and a drain contact to the source and the drain region, respectively.

In embodiments, forming a source and a drain contact may comprise a preliminary step, performed before step b, of providing a dummy source and a dummy drain contact, and subsequently, after step c, replacing the dummy source and the dummy drain contact by an actual conductive source and an actual conductive drain contact. Dummy source or drain contacts may be used when the thermal budget involved in step c would deteriorate the source or drain contacts. In this case, dummy source or drain contacts are used before and during step c and replaced after step c.

In embodiments, forming a gate may comprise a preliminary step of providing a dummy gate during step a, and subsequently replacing the dummy gate by an actual gate after step c. In embodiments, the gate may comprise a gate dielectric (e.g. a high k dielectric) and a gate contact (e.g. Cu or W).

The gate may surround the $Si_{1-x}Ge_x$ or $Si_{1-x'}Ge_{x'}$ structure on all lateral sides. Within this context, a surface at a longitudinal end of the $Si_{1-x}Ge_x$ or $Si_{1-x'}Ge_{x'}$ structure is thus not considered to be a lateral side. In other words, if the gate surrounds the $Si_{1-x}Ge_x$ or $Si_{1-x'}Ge_{x'}$ structure on all lateral sides, a cross-section, perpendicular to the longitudinal axis, of the $Si_{1-x}Ge_x$ or $Si_{1-x'}Ge_{x'}$ structure exists wherein the gate is in contact with the entire outer border of the $Si_{1-x}Ge_x$ or $Si_{1-x'}Ge_{x'}$ structure in the cross-section. A gate surrounding the $Si_{1-x}Ge_x$ or $Si_{1-x'}Ge_{x'}$ structure on all lateral sides may typically be referred to as a gate-all-around.

In embodiments, when the $Si_{1-x}Ge_x$ or $Si_{1-x'}Ge_{x'}$ structure is a cuboid, the gate may surround the $Si_{1-x}Ge_x$ or $Si_{1-x'}Ge_{x'}$ structure on at least 3 lateral sides, such as all lateral sides.

In embodiments, when the $Si_{1-x}Ge_x$ or $Si_{1-x'}Ge_{x'}$ structure has a circular cross-section taken perpendicularly to the length of the structure, the structure may have a single lateral side and the gate may surround the $Si_{1-x}Ge_x$ or $Si_{1-x'}Ge_{x'}$ structure on this lateral side, i.e. on all lateral sides.

In embodiments, transforming the subset of $Si_{1-x}Ge_x$ structures into a subset of $Si_{1-x'}Ge_{x'}$ structures may comprise transforming the one or more $Si_{1-x}Ge_x$ structures within at least one of the fin structures, while maintaining the one or more $Si_{1-x}Ge_x$ structures within at least another of the fin structures.

In a second aspect, the present disclosure relates to a semiconductor device, comprising
i. a $Si_{1-x}Ge_x$ structure with $0 \leq x < 1$, and
ii. a $Si_{1-x'}Ge_{x'}$ structure with $x < x' \leq 1$, and
iii. a $Si_{1-y}Ge_yO_2$ layer on the $Si_{1-x'}Ge_{x'}$ structure with $0 < y < 1$.

The semiconductor device according to the second aspect may be an intermediate in the fabrication of the semiconductor device of the third aspect.

In some embodiments, y may be $0 \leq y < 1$, $0.1 \leq y < 1$, $0.5 \leq y < 1$, or $0.8 \leq y < 1$.

In embodiments, the $Si_{1-x}Ge_x$ structure and/or the $Si_{1-x'}Ge_{x'}$ structure may have at least one dimension equal to or smaller than 25 nm, equal to or smaller than 15 nm, or equal to or smaller than 10 nm. In embodiments, the $Si_{1-x}Ge_x$ structure and/or the $Si_{1-x'}Ge_{x'}$ structure may be nanowires or nanosheets.

In embodiments, the Ge concentration measured at the surface of the $Si_{1-x'}Ge_{x'}$ structure may be within 75%, within 50%, within 30%, within 10%, or within 5%, of the Ge concentration at the centre of the $Si_{1-x'}Ge_{x'}$ structure.

In embodiments, the Ge concentration measured at each location in the $Si_{1-x'}Ge_{x'}$ structure may be always within 75%, within 50%, within 30%, within 10%, or within 5%, of the Ge concentration at any other location in the $Si_{1-x'}Ge_{x'}$ structure. For instance, if the largest discrepancy of concentration measurable within a $Si_{1-x'}Ge_{x'}$ structure is a measure of 80 at % Ge at one location and 78 at % at another location, it can be considered that the Ge concentration measured at each location in the $Si_{1-x'}Ge_{x'}$ structure will always be within 2.5% of the concentration at any other location in the $Si_{1-x'}Ge_{x'}$ structure. This is calculated from (80 at %-78 at %)/80 at %=0.025 or 2.5%; we subtract the lower concentration from the highest concentration and we divide that difference by the highest concentration.

In embodiments, the semiconductor device may further comprise:
a gate covering part of the $Si_{1-x}Ge_x$ structure or $Si_{1-x'}Ge_{x'}$ structure, thereby defining a channel in each of said parts,
a source and a drain region in the $Si_{1-x}Ge_x$ structure or $Si_{1-x'}Ge_{x'}$ structure at opposite ends of each channel,
a source contact and a drain contact on the source region and the drain region respectively.

In embodiments, the gate may surround the $Si_{1-x}Ge_x$ or $Si_{1-x'}Ge_{x'}$ structure on at least 3 sides or on all sides.

In embodiments, any feature of the second aspect or its embodiments may be as correspondingly described for the first aspect or the third aspect and its embodiments.

In a third aspect, the present disclosure relates to a semiconductor device comprising:
- a substrate having a top surface,
- a longitudinal $Si_{1-x}Ge_x$ structure having a first longitudinal axis running parallel to the top surface of the substrate and separated therefrom by a non-null distance d,
- a longitudinal $Si_{1-x'}Ge_{x'}$ structure having a second longitudinal axis running parallel to the top surface of the substrate and separated therefrom by the non-null distance d so that both the first and the second longitudinal axis belong to a same plane parallel to the top surface of the substrate.

In embodiments, any feature of the third aspect or its embodiments may be as correspondingly described for the first or the second aspect and its embodiments.

The invention will now be described by a detailed description of several embodiments. It is understood that other embodiments can be configured without departing from the technical teaching of the disclosure, the invention being limited only by the terms of the appended claims.

Reference will be made to transistors. These are devices typically having a first main electrode such as a drain, a second main electrode such as a source and a control electrode such as a gate for controlling the flow of electrical charges between the first and second main electrodes.

It is understood that the present disclosure is also applicable to similar devices that can be configured in any transistor technology, including for example, but not limited thereto, CMOS, BICMOS, Bipolar and SiGe BICMOS technology.

Example 1: Transforming a $Si_{1-x}Ge_x$ Nanowire into a $Si_{1-x'}Ge_{x'}$ Nanowire According to Example Embodiments We now refer to FIG. 1. In the upper left, a cross-section is shown of a $Si_{1-x}Ge_x$ nanowire (202) having a layer of $GeO_2$ (250) therearound. Upon heating up the $Si_{1-x}Ge_x$ nanowire (202), a reaction between the $Si_{1-x}Ge_x$ and $GeO_2$ occurs, thereby exchanging Si atoms from the $Si_{1-x}Ge_x$ with Ge atoms from the $GeO_2$.

Depending on the circumstances, such as the temperature of heating and the dimensions of the nanowire, this action may directly result (solid arrow) in a $Si_{1-x}Ge_{x'}$ nanowire (110), having a relatively uniform distribution of the Ge concentration, and a layer of $Si_{1-y}Ge_yO_2$ (260) with y<1 therearound.

Under other circumstances, the reaction may in a first step (dashed arrow) be limited to an outer shell (210) of the nanowire, while a centre portion (220) of the nanowire may remain similar to the original $Si_{1-x}Ge_x$ nanowire (202). A further step of homogenizing the outer shell (210) with the centre portion (220) may then be desired, typically achievable by further heating the nanowire (i.e. for a longer time and/or at a higher temperature).

Figure 3A:
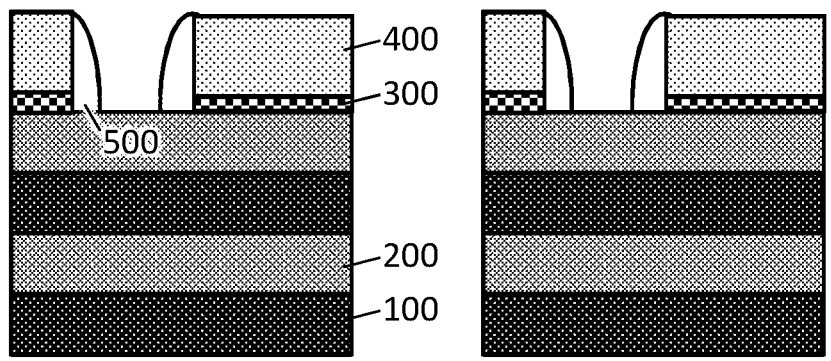
FIG. 3A is a schematic representation of a method for integrating a $Si_{1-x}Ge_x$ nanowire FET with a $Si_{1-x'}Ge_{x'}$ nanowire FET, without using the concepts of example embodiments.

Comparative Example: Integrating a Si Nanowire FET with a $Si_{0.7}Ge_{0.3}$ Nanowire FET, without Using the Concepts of Example Embodiments We now refer to FIG. 3a. Two semiconductor sub-devices are schematically depicted in cross-section, which are typically present on a same substrate and will form part of a same semiconductor device. Each semiconductor sub-device comprises a fin structure, consisting of alternating layers of Si (200) and $Si_{0.7}Ge_{0.3}$ (100) for forming nanowires, a dummy gate comprising a dummy gate dielectric (300) and a dummy gate contact (400), and spacers (500).

Figure 3B:
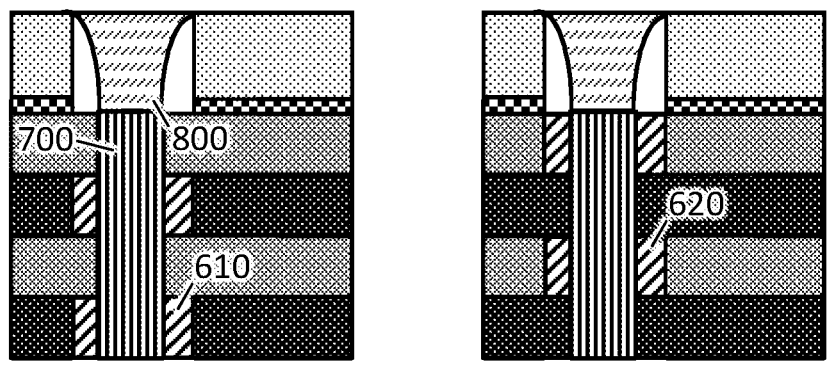
FIG. 3B is a schematic representation of a method for integrating a $Si_{1-x}Ge_x$ nanowire FET with a $Si_{1-x'}Ge_{x'}$ nanowire FET, without using the concepts of example embodiments.

We now refer to FIG. 3b. An opening is made in the alternating layers between the spacers (500) and internal spacers (610, 620) are formed, before filling the opening with a source or drain contact (700) and capping (800) the source or drain contact (700) with a dielectric. Only one source or drain contact (700) is depicted per sub-device; the second contact, used to form a field effect transistor (FET), is not depicted. Note that internal spacers (610) are made at the level of the $Si_{0.7}Ge_{0.3}$ layers (100) for the left sub-device, while internal spacers (620) are made at the level of the Si layers (200) for the right sub-device; however, no satisfactory process is currently known for making these different internal spacers (610, 620). No such process for forming such SiGe internal spacers exists when starting from a Si/SiGe multilayer. Indeed, the internal spacer (610, 620) formation for the SiGe layers starting from a Si/SiGe stack may include an oxidation or deposition process which is selective toward Si with respect to SiGe. No such process is currently available. Furthermore, this internal spacer (610, 620) formation further includes a selective etching of Si with respect to SiGe. Existing selective methods of this kind are not satisfactory because the Si plane with miller indices (111) has an etch rate which is similar to the etch rate of SiGe.

Figure 3C:
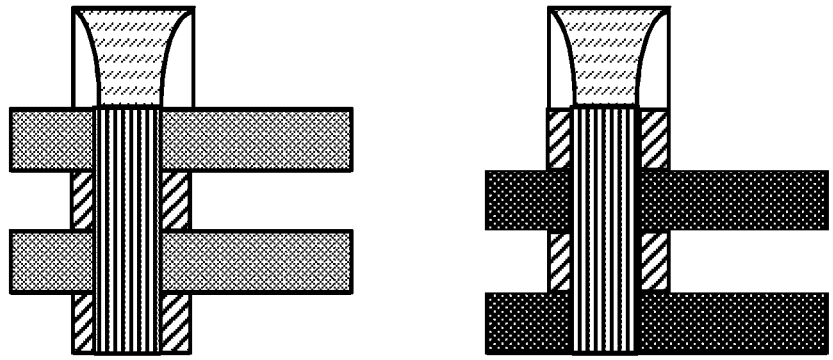
FIG. 3C is a schematic representation of a method for integrating a $Si_{1-x}Ge_x$ nanowire FET with a $Si_{1-x'}Ge_{x'}$ nanowire FET, without using the concepts of example embodiments.

We now refer to FIG. 3c. The dummy gate (300, 400) is removed and the $Si_{0.7}Ge_{0.3}$ layers (100) or Si layers (200) are selectively removed (e.g. etched) with respect to one another: the $Si_{0.7}Ge_{0.3}$ layers (100) for the left sub-device and the Si layers (200) for the right sub-device; leaving Si layers (200) for the left sub-device and $Si_{0.7}Ge_{0.3}$ layers (100) for the right sub-device. This means that different selective etch processes with the opposite selectivity may exist, which is not trivial.

Figure 3D:
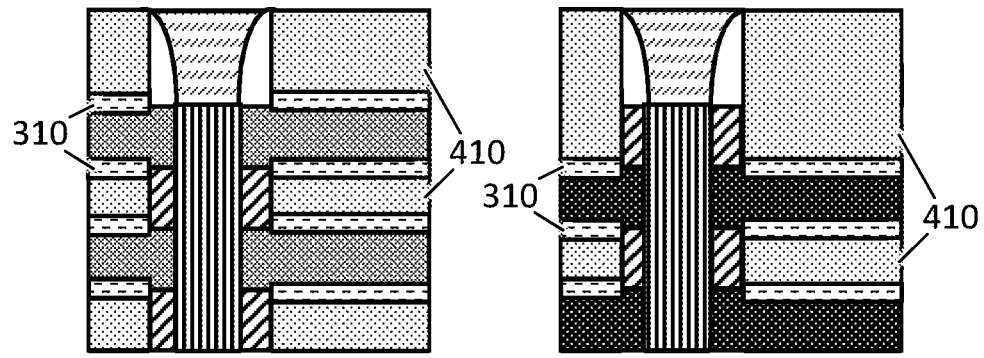
FIG. 3D is a schematic representation of a method for integrating a $Si_{1-x}Ge_x$ nanowire FET with a $Si_{1-x'}Ge_{x'}$ nanowire FET, without using the concepts of example embodiments.

We now refer to FIG. 3d. A gate-all-around is formed around the Si layers (200) and $Si_{0.7}Ge_{0.3}$ layers (100), comprising a gate dielectric (310) and a gate contact (410). Note that the Si layers (200) and $Si_{0.7}Ge_{0.3}$ layers (100) are each present at a different height, i.e. different distances from the substrate, which may result in undesired differences in sub-device performance. Furthermore, the gate has a different height in the left sub-device than in the right sub-device, which will make the contact module more difficult.

Figure 4A:
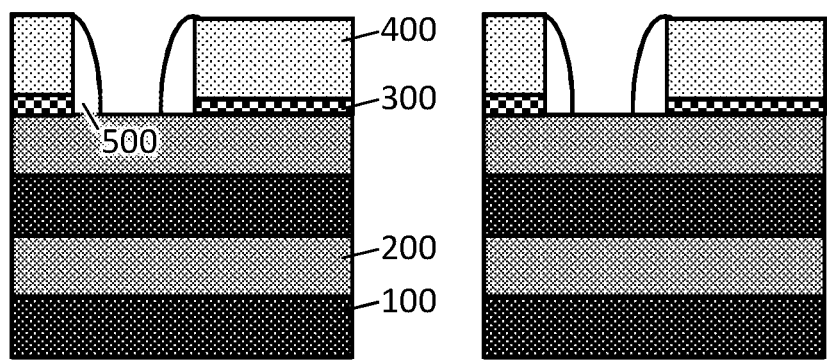
FIG. 4A is a schematic representation of a method for integrating a $Si_{1-x}Ge_x$ nanowire FET with a $Si_{1-x'}Ge_{x'}$ nanowire FET, according to example embodiments.

Example 2: Integrating a $Si_{1-x}Ge_x$ Nanowire FET with a $Si_{1-x'}Ge_{x'}$ Nanowire FET, According to Example Embodiments We now refer to FIG. 4a. Two semiconductor sub-devices are schematically depicted in cross-sections taken perpendicularly to the width of a fin structure and parallel to its longitudinal axis. The two semiconductor sub-devices are typically present on a same substrate (not depicted). Each semiconductor sub-device comprises a fin structure, consisting of alternating layers of $Si_{1-x}Ge_x$ (200, e.g. Si) and $Si_{1-z}Ge_z$ (100, z≤1 e.g. $Si_{0.7}Ge_{0.3}$) for forming nanowires, a dummy gate comprising a dummy gate dielectric (300) and a dummy gate contact (400), and spacers (500).

Figure 4B:
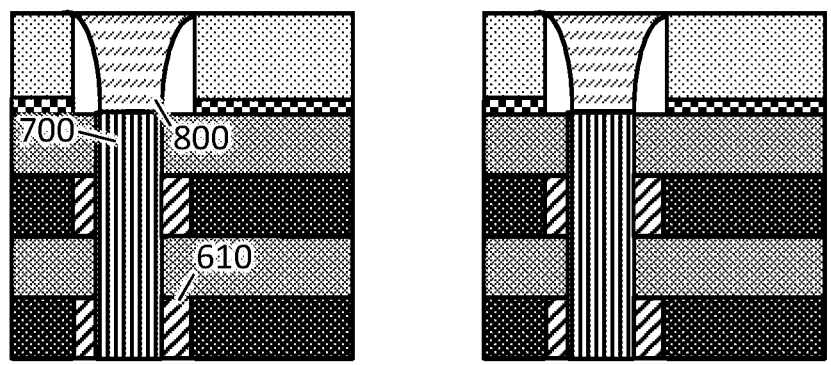
FIG. 4B is a schematic representation of a method for integrating a $Si_{1-x}Ge_x$ nanowire FET with a $Si_{1-x'}Ge_{x'}$ nanowire FET, according to example embodiments.

We now refer to FIG. 4b. An opening is made in the alternating layers between two spacers (500) and internal spacers (610) are formed, before filling the opening with a source or drain contact (700) and capping (800) the source or drain contact (700) with a dielectric. Note that, contrary to the comparative example, internal spacers (610) are made at the level of the $Si_{1-z}Ge_z$ layers (100) for both sub-devices; thereby avoiding the problem of having to make different internal spacers. Further note that only one source or drain contact (700) is depicted per sub-device; the second one source or drain contact, used to form a field effect transistor (FET), is not depicted.

Figure 4C:
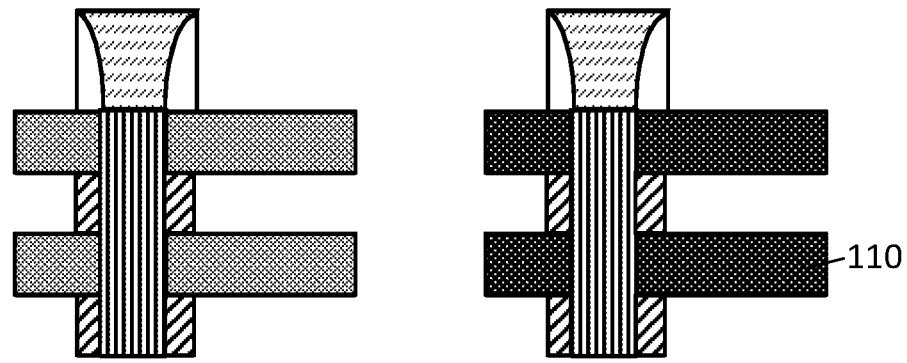
FIG. 4C is a schematic representation of a method for integrating a $Si_{1-x}Ge_x$ nanowire FET with a $Si_{1-x'}Ge_{x'}$ nanowire FET, according to example embodiments.

We now refer to FIG. 4c. The dummy gate (300, 400) is removed and the $Si_{1-z}Ge_z$ layers (100) are selectively removed (e.g. etched) with respect to the $Si_{1-x}Ge_x$ layers (200); leaving $Si_{1-x}Ge_x$ layers (200) in both sub-devices. We can call the remaining layers, "nanowires". The $Si_{1-x}Ge_x$ layers (200) in the right sub-device are subsequently transformed into $Si_{1-x'}Ge_{x'}$ nanowires (110) as described in example 1. Note that, contrary to the comparative example, the $Si_{1-z}Ge_z$ layers (100) and the $Si_{1-x'}Ge_{x'}$ nanowires (110) may not have the same composition. As such, the sacrificial material $Si_{1-z}Ge_z$ may be chosen in function of its selective removal with respect to $Si_{1-x}Ge_x$, independent of the desired $Si_{1-x'}Ge_{x'}$ for the nanowires.

Figure 4D:
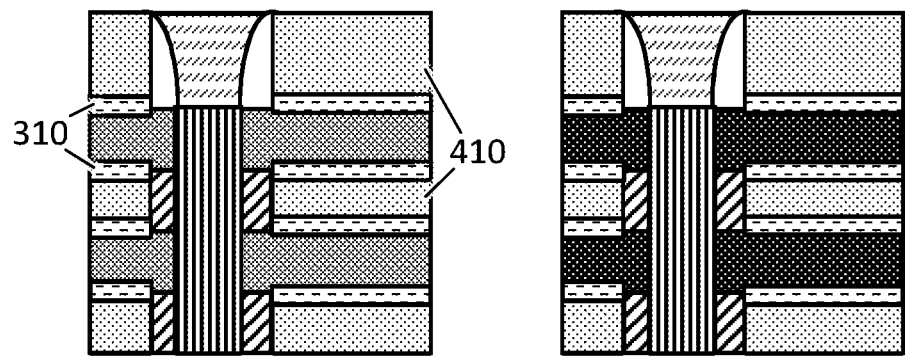
FIG. 4D is a schematic representation of a method for integrating a $Si_{1-x}Ge_x$ nanowire FET with a $Si_{1-x'}Ge_{x'}$ nanowire FET, according to example embodiments.

We now refer to FIG. 4d. A gate-all-around is formed around the $Si_{1-x}Ge_x$ layers (200) and $Si_{1-x'}Ge_{x'}$ nanowires (110), comprising a gate dielectric (310) and a gate contact (410). Note that, contrary to the comparative example, the $Si_{1-x}Ge_x$ layers (200) and $Si_{1-x'}Ge_{x'}$ nanowires (110) are both present at the same height, i.e. they are vertically aligned, thus avoiding the resulting undesired differences in sub-device performance. Also, no specific $Si_{1-x'}Ge_{x'}$ internal spacer module is used and the gate has the same height for both the $Si_{1-x}Ge_x$ layers (200) and the $Si_{1-x'}Ge_{x'}$ nanowires (110).

Figure 5A:
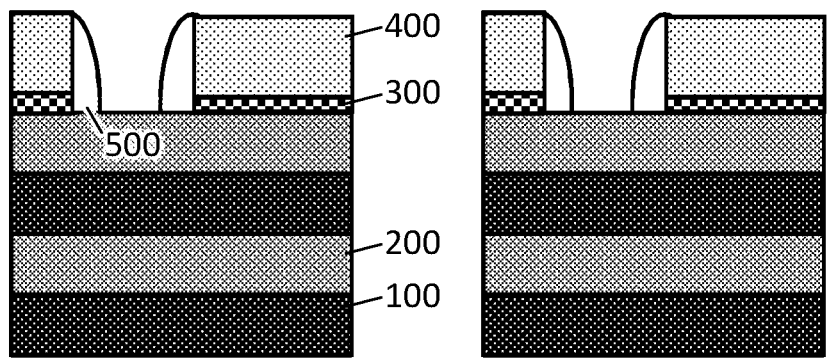
FIG. 5A is a schematic representation of a method for integrating a $Si_{1-x}Ge_x$ nanowire FET with a $Si_{1-x'}Ge_{x'}$ nanowire FET, using a dummy source/drain, according to example embodiments.

Example 3: Integrating a $Si_{1-x}Ge_x$ Nanowire FET with a $Si_{1-x'}Ge_{x'}$ Nanowire FET, Using a Dummy Source/Drain, According to Example Embodiments We now refer to FIG. 5a. Two semiconductor sub-devices are schematically depicted, which are typically present on a same substrate. Each semiconductor sub-device comprises a fin structure, consisting of alternating layers of $Si_{1-x}Ge_x$ (200, e.g. Si) and $Si_{1-z}Ge_z$ (100, e.g. $Si_{0.7}Ge_{0.3}$) for forming nanowires, a dummy gate comprising a dummy gate dielectric (300) and a dummy gate contact (400), and spacers (500).

Figure 5B:
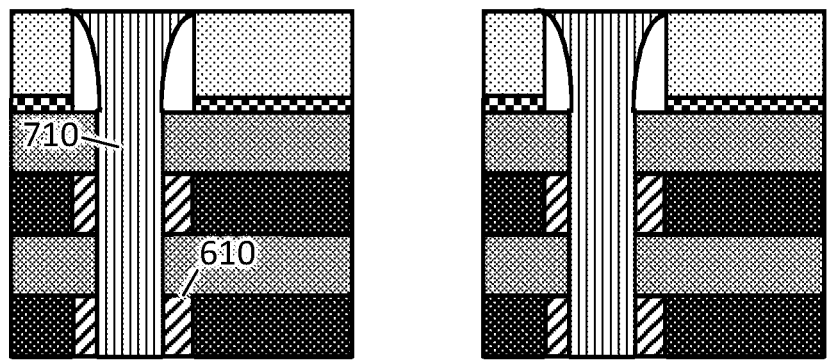
FIG. 5B is a schematic representation of a method for integrating a $Si_{1-x}Ge_x$ nanowire FET with a $Si_{1-x'}Ge_{x'}$ nanowire FET, using a dummy source/drain, according to example embodiments.

We now refer to FIG. 5b. An opening is made in the alternating layers between two spacers (500) and internal spacers (610) are formed, before filling the opening with a dummy source or drain contact (710). Note that, contrary to the comparative example, internal spacers (610) are made at the level of the $Si_{1-z}Ge_z$ layers (100) for both sub-devices; thereby avoiding the problem of having to make different internal spacers. Further note that only one source or drain contact (700) is depicted per sub-device; the second contact, used to form a field effect transistor (FET), is not depicted.

Figure 5C:
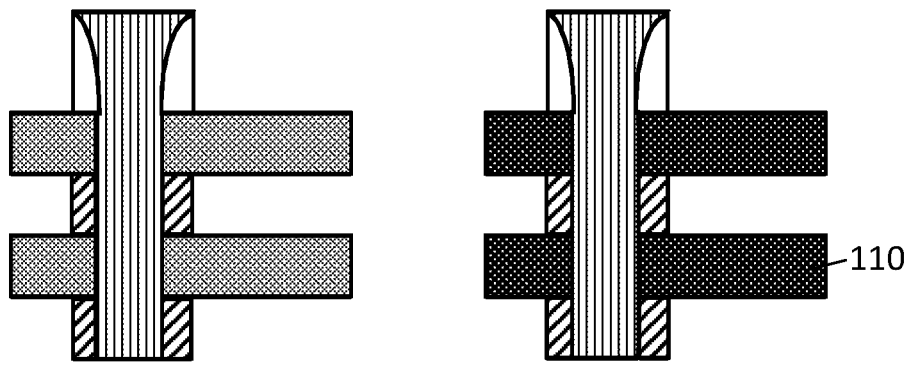
FIG. 5C is a schematic representation of a method for integrating a $Si_{1-x}Ge_x$ nanowire FET with a $Si_{1-x'}Ge_{x'}$ nanowire FET, using a dummy source/drain, according to example embodiments.

We now refer to FIG. 5c. The dummy gate (300, 400) is removed and the $Si_{1-z}Ge_z$ layers (100) are selectively removed (e.g. etched) with respect to the $Si_{1-x}Ge_x$ layers (200); leaving $Si_{1-x}Ge_x$ layers (200) in both sub-devices. The $Si_{1-x}Ge_x$ layers (200) in the right sub-device are subsequently transformed into $Si_{1-x'}Ge_{x'}$ nanowires (110) as described in example 1. Note that, contrary to the comparative example, the $Si_{1-z}Ge_z$ layers (100) and the $Si_{1-x'}Ge_{x'}$ nanowires (110) may not have the same composition. As such, the sacrificial material $Si_{1-z}Ge_z$ may be chosen in function of its selective removal with respect to $Si_{1-x}Ge_x$, independent of the desired $Si_{1-x'}Ge_{x'}$ for the nanowires.

Figure 5D:
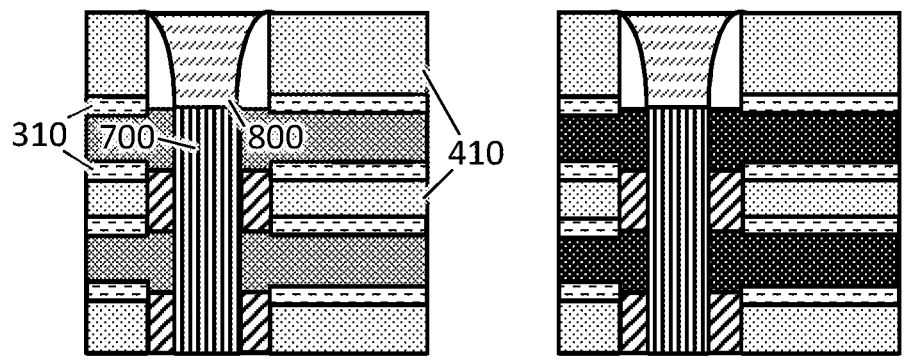
FIG. 5D is a schematic representation of a method for integrating a $Si_{1-x}Ge_x$ nanowire FET with a $Si_{1-x'}Ge_{x'}$ nanowire FET, using a dummy source/drain, according to example embodiments.

We now refer to FIG. 5d. The dummy source or drain contacts (710) are removed, before filling the opening with an actual source or drain contact (700) and capping (800) the source or drain contact (700) with a dielectric. Furthermore, a gate-all-around is formed around the $Si_{1-x}Ge_x$ layers (200) and $Si_{1-x'}Ge_{x'}$ nanowires (110), comprising a gate dielectric (310) and a gate contact (410). Note that, contrary to the comparative example, the $Si_{1-x}Ge_x$ layers (200) and $Si_{1-x'}Ge_{x'}$ nanowires (110) are both present at the same height, thus avoiding the resulting undesired differences in sub-device performance.

It is to be understood that although embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method for integrating $Si_{1-x}Ge_x$ structures with $Si_{1-x'}Ge_{x'}$ structures in a semiconductor device comprising:
    providing a device comprising a plurality of $Si_{1-x}Ge_x$ structures, wherein $0 \leq x < 1$;
    depositing a layer of $GeO_2$ on a subset of the $Si_{1-x}Ge_x$ structures,
    wherein, before depositing the layer of $GeO_2$ on the subset of the $Si_{1-x}Ge_x$ structures, two or more fin structures are present in the semiconductor device, and
    wherein the two or more fin structures comprise one or more $Si_{1-x}Ge_x$ structures alternated with a sacrificial material;
    heating at least the subset of $Si_{1-x}Ge_x$ structures at a temperature high enough and for a time long enough to transform the subset of the $Si_{1-x}Ge_x$ structures into a subset of $Si_{1-x'}Ge_{x'}$ structures with x'>x, wherein heating at least the subset of $Si_{1-x}Ge_x$ structures transforms the layer of $GeO_2$ into a layer of $Si_{1-y}Ge_yO_2$, wherein $0 < y < 1$;
    depositing an additional layer of $GeO_2$ on a subset of the $Si_{1-x'}Ge_{x'}$ structures; and
    heating at least the subset of $Si_{1-x'}Ge_{x'}$ structures to further increase x'.

2. The method according to claim 1, wherein the $Si_{1-x}Ge_x$ structures have at least one dimension equal to or smaller than 25 nm.

3. The method according to claim 1, wherein the plurality of $Si_{1-x}Ge_x$ structures comprises nanosheets.

4. The method according to claim 1, wherein depositing the layer of $GeO_2$ on the subset of the $Si_{1-x}Ge_x$ structures comprises depositing a conformal layer of $GeO_2$ on the subset of the $Si_{1-x}Ge_x$ structures.

5. The method according to claim 1, wherein the temperature high enough to transform the subset of the $Si_{1-x}Ge_x$ structures into the subset of $Si_{1-x'}Ge_{x'}$ structures with x'>x is at least 400° C. and at most 950° C.

6. The method according to claim 1, wherein the time long enough to transform the subset of the $Si_{1-x}Ge_x$ structures into the subset of $Si_{1-x'}Ge_{x'}$ structures with x'>x is long enough to homogenize a chemical composition of at least one of the $Si_{1-x'}Ge_{x'}$ structures.

7. The method according to claim 1,
    wherein the $Si_{1-x'}Ge_{x'}$ structures with x'>x comprise nanowires, and wherein a chemical composition of the $Si_{1-x'}Ge_{x'}$ structures with x'>x is radially symmetrical.

8. The method according to claim 1, further comprising selectively removing the sacrificial material with respect to the one or more $Si_{1-x}Ge_x$ structures.

9. The method according to claim 1, further comprising forming a transistor comprising:
   two source or drain contacts on opposite ends of a respective $Si_{1-x}Ge_x$ structure or of a respective $Si_{1-x'}Ge_{x'}$ structure; and
   a gate, thereby defining a channel in the respective $Si_{1-x}Ge_x$ structure or the respective $Si_{1-x'}Ge_{x'}$ structure.

10. The method according to claim 1, wherein transforming the subset of the $Si_{1-x}Ge_x$ structures into the subset of $Si_{1-x'}Ge_{x'}$ structures comprises transforming the one or more $Si_{1-x}Ge_x$ structures within at least one of the fin structures while maintaining the one or more $Si_{1-x}Ge_x$ structures within at least another of the fin structures.

11. A semiconductor device comprising:
   a substrate having a top surface;
   a longitudinal $Si_{1-x}Ge_x$ structure having a first longitudinal axis running parallel to the top surface of the substrate and separated therefrom by a non-null distance;
   a longitudinal $Si_{1-x'}Ge_{x'}$ structure having a second longitudinal axis running parallel to the top surface of the substrate and separated therefrom by the non-null distance such that both the first longitudinal axis and the second longitudinal axis belong to a same plane parallel to the top surface of the substrate; and
   a passivation oxide overlying the $Si_{1-x'}Ge_{x'}$ structure, wherein the passivation oxide comprises $Si_{1-y}Ge_yO_2$ with 0<y<1.

12. The semiconductor device according to claim 11, wherein the longitudinal $Si_{1-x}Ge_x$ structure or the longitudinal $Si_{1-x'}Ge_{x'}$ structure has at least one dimension equal to or smaller than 25 nm.

13. The semiconductor device according to claim 11, wherein the longitudinal $Si_{1-x'}Ge_{x'}$ structure has an inhomogeneous Ge concentration characterized by a spatial gradient such that a higher Ge concentration is present near a surface of the longitudinal $Si_{1-x'}Ge_{x'}$ structure and a lower Ge concentration is present away from the surface of the longitudinal $Si_{1-x'}Ge_{x'}$ structure.

14. The semiconductor device according to claim 11, wherein a Ge concentration at each location in the longitudinal $Si_{1-x'}Ge_{x'}$ structure is within 10% of the Ge concentration at every other location in the longitudinal $Si_{1-x'}Ge_{x'}$ structure.

15. The semiconductor device according to claim 11, further comprising:
   a gate covering part of the longitudinal $Si_{1-x}Ge_x$ structure or part of the longitudinal $Si_{1-x'}Ge_{x'}$ structure, thereby defining a channel in the part of the longitudinal $Si_{1-x}Ge_x$ structure or the part of the longitudinal $Si_{1-x'}Ge_{x'}$ structure;
   a source region and a drain region in the longitudinal $Si_{1-x}Ge_x$ structure or the longitudinal $Si_{1-x'}Ge_{x'}$ structure at opposite ends of each channel; and
   a source contact and a drain contact on the source region and the drain region, respectively.

16. A method for integrating $Si_{1-x}Ge_x$ structures with $Si_{1-x'}Ge_{x'}$ structures in a semiconductor device comprising:
   providing a device comprising a plurality of $Si_{1-x}Ge_x$ structures, wherein 0≤x<1;
   depositing a layer of $GeO_2$ on a subset of the $Si_{1-x}Ge_x$ structures,
   wherein, before depositing the layer of $GeO_2$ on the subset of the $Si_{1-x}Ge_x$ structures, two or more fin structures are present in the semiconductor device, and
   wherein the two or more fin structures comprise one or more $Si_{1-x}Ge_x$ structures alternated with a sacrificial material; and
   heating at least the subset of $Si_{1-x}Ge_x$ structures at a temperature high enough and for a time long enough to transform the subset of the $Si_{1-x}Ge_x$ structures into a subset of $Si_{1-x'}Ge_{x'}$ structures with x'>x,
   wherein the $Si_{1-x}Ge_x$ structures have at least one dimension equal to or smaller than 25 nm, and
   wherein heating at least the subset of $Si_{1-x}Ge_x$ structures transforms the layer of $GeO_2$ into a layer of $Si_{1-y}Ge_yO_2$, wherein 0<y<1;
   depositing an additional layer of $GeO_2$ on a subset of the $Si_{1-x'}Ge_{x'}$ structures;
   heating at least the subset of $Si_{1-x'}Ge_{x'}$ structures to further increase x'; and
   forming a transistor comprising:
      two source or drain contacts on opposite ends of a respective $Si_{1-x}Ge_x$ structure or of a respective $Si_{1-x'}Ge_{x'}$ structure; and
      a gate, thereby defining a channel in the respective $Si_{1-x}Ge_x$ structure or the respective $Si_{1-x'}Ge_{x'}$ structure,
   wherein forming the transistor comprises:
      providing a dummy source contact and a dummy drain contact; and
      replacing the dummy source contact with a conductive source contact and the dummy drain contact with a conductive drain contact.

17. The method according to claim 16, wherein the plurality of $Si_{1-x}Ge_x$ structures comprises nanosheets.

18. The method according to claim 16, wherein depositing the layer of $GeO_2$ on the subset of the $Si_{1-x}Ge_x$ structures comprises depositing a conformal layer of $GeO_2$ on the subset of the $Si_{1-x}Ge_x$ structures.

19. The method according to claim 16, wherein the temperature high enough to transform the subset of the $Si_{1-x}Ge_x$ structures into the subset of $Si_{1-x'}Ge_{x'}$ structures with x'>x is at least 400° C. and at most 950° C.

20. The method according to claim 16, wherein the time long enough to transform the subset of the $Si_{1-x}Ge_x$ structures into the subset of $Si_{1-x'}Ge_{x'}$ structures with x'>x is long enough to homogenize a chemical composition of at least one of the $Si_{1-x'}Ge_{x'}$ structures.

* * * * *